US 12,431,892 B2

(12) United States Patent
Kumazawa

(10) Patent No.: US 12,431,892 B2
(45) Date of Patent: Sep. 30, 2025

(54) SEMICONDUCTOR DEVICE

(71) Applicant: FUJI ELECTRIC CO., LTD., Kawasaki (JP)

(72) Inventor: Yuki Kumazawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 99 days.

(21) Appl. No.: 18/474,562

(22) Filed: Sep. 26, 2023

(65) Prior Publication Data

US 2024/0014813 A1    Jan. 11, 2024

Related U.S. Application Data

(63) Continuation of application No. PCT/JP2022/033784, filed on Sep. 8, 2022.

(30) Foreign Application Priority Data

Oct. 28, 2021  (JP) .................. 2021-176247

(51) Int. Cl.
  *H02M 1/08*   (2006.01)
  *H03K 17/082* (2006.01)
  *H03K 17/16*  (2006.01)
  *H03K 17/08*  (2006.01)

(52) U.S. Cl.
  CPC ............ *H03K 17/168* (2013.01); *H02M 1/08* (2013.01); *H03K 17/0828* (2013.01); *H03K 2017/0806* (2013.01)

(58) Field of Classification Search
  CPC ............... H02M 1/08; H03K 17/08116; H03K 17/08128; H03K 17/08148; H03K 17/0828; H03K 17/168; H03K 2017/0806

USPC .................................. 327/108, 109, 110, 111
See application file for complete search history.

(56) References Cited

U.S. PATENT DOCUMENTS

| 5,977,814 A | 11/1999 | Ishii |
| 2018/0138902 A1 | 5/2018 | Lu et al. |
| 2022/0069735 A1 | 3/2022 | Kumazawa |

(Continued)

FOREIGN PATENT DOCUMENTS

| JP | 10-313570 A | 11/1998 |
| JP | 2014-138537 A | 7/2014 |
| JP | 2022-41081 A | 3/2022 |

(Continued)

OTHER PUBLICATIONS

International Search Report dated Nov. 29, 2022 for International Application No. PCT/JP2022/033784.

(Continued)

*Primary Examiner* — William Hernandez

(57) ABSTRACT

An object of the present invention is to provide a semiconductor device capable of suppressing loss in a switching element at high temperature without increasing radiation noise of the switching element. A semiconductor device includes an IGBT including a gate to which a gate signal is input, a temperature detection element that detects temperature of the IGBT, and a capacitance adjustment unit that is arranged between the gate of the IGBT and a reference potential terminal and that adjusts a capacitance between the gate and an emitter of the IGBT according to a detection temperature detected by the temperature detection element.

11 Claims, 8 Drawing Sheets

(56) References Cited

U.S. PATENT DOCUMENTS

2022/0345128 A1   10/2022  Nagatomi et al.
2023/0122671 A1*  4/2023  Mitsui .................. H02M 1/327
                                                                 361/93.8

FOREIGN PATENT DOCUMENTS

WO      2021/117661 A1   6/2021
WO      2021/192035 A1   9/2021

OTHER PUBLICATIONS

Written Opinion of the International Searching Authority (Form PCT/ISA/237) dated Nov. 29, 2022 for International Application No. PCT/JP2022/033784.

* cited by examiner

SEMICONDUCTOR DEVICE

CROSS-REFERENCE TO RELATED APPLICATION

This application is a continuation application filed under 35 U.S.C. § 111 (a) of International Patent Application No. PCT/JP2022/033784, filed on Sep. 8, 2022, which claims priority from Japanese Patent Application No. 2021-176247, filed on Oct. 28, 2021, the contents of each of which are incorporated herein by reference.

TECHNICAL FIELD

The present invention relates to semiconductor devices applied to power converters and the like.

BACKGROUND ART

Insulated gate bipolar transistors (IGBTs), bipolar transistors, and metal-oxide-semiconductor field-effect transistors (MOSFETs) are widely used as switching elements. These switching elements are generally often used in the form of power modules incorporating a plurality of pairs of switching elements and free wheeling diodes (FWDs) connected in anti-parallel to the switching elements in a single package. Additionally, development of intelligent power modules (IPMs) in which driver circuits and protection functions are added to such power modules is also being actively pursued.

Power modules and IPMs include a gate capacitor connected to a control signal input terminal of a switching element (e.g., the gate of an IGBT). The gate capacitor is used to suppress radiation noise generated during turn-on by reducing an instantaneous voltage change (recovery voltage change rate (dv/dt)) due to reverse recovery of the free wheeling diode when the switching element switches from an OFF state to an ON state (i.e., at turn-on). The gate capacitor is mounted on a control circuit section provided on a control substrate (a printed circuit board). The gate capacitor is added by a user or the like who uses a power module or IPM.

Additionally, in general, power modules and IPMs are equipped with an overheat protection function that protects IGBTs from overheating. To protect each IGBT from overheating, a temperature detection diode is used that is incorporated together with the IGBT in an IGBT chip. IGBT modules and IPMs use negative temperature characteristics of the diode to detect whether the IGBT chip is overheating or not. When IGBT modules or IPMs detect that the IGBT chip is overheating, they stop operation of the IGBT.

PTL 1 (for example, JP H10-313570 A) discloses an IGBT driver circuit capable of easily switching an IGBT between a high dv/dt normal mode and a low dv/dt mode to facilitate suppression of high-frequency leakage current.

SUMMARY OF INVENTION

Technical Problem

In general, the larger the IGBT recovery voltage change rate, the greater the radiation noise associated with operation of the switching device (e.g., IGBT), but the lower the loss generated by the switching element (generated loss). On the other hand, the smaller the recovery voltage change rate, the lower the radiation noise associated with the operation of the switching element, but greater the loss generated by the switching element. In other words, in the switching element, there is a trade-off relationship between the radiation noise and the generated loss.

Furthermore, recovery voltage change rate tends to decrease as the temperature of a semiconductor chip incorporating switching elements such as IGBTs increases. Therefore, the recovery voltage change rate in a switching element is greater at room temperature than at high temperature. The radiation noise of the switching element is adjusted by a capacitance value of the gate capacitor so as to be smaller than a predetermined value within an operable temperature range of the switching element. The capacitance value of the gate capacitor is determined by a recovery voltage change rate of the switching element at room temperature. Due to this, when the temperature of a switching element such as an IGBT increases, the recovery voltage change rate becomes smaller than necessary, leading to an increase in loss generated by the switching element.

It is an object of the present invention to provide a semiconductor device capable of suppressing loss in a switching element at high temperature without increasing radiation noise of the switching element.

Solution to Problem

In order to achieve the above object, a semiconductor device includes a switching element including a control signal input terminal to which a switching control signal is input, a temperature detection element configured to detect temperature of the switching element to output a detection temperature, and a capacitance adjustment unit arranged between the control signal input terminal and a reference potential terminal and configured to adjust a capacitance between a gate and an emitter of the switching element according to the detection temperature.

Advantageous Effects of Invention

According to an aspect of the present invention, loss in a switching element at high temperature can be suppressed without increasing radiation noise of the switching element.

DESCRIPTION OF EMBODIMENTS

Each embodiment of the present invention exemplifies devices and methods for embodying the technological idea of the present invention, and the technological idea of the present invention does not specify materials, shapes, structures, arrangements, and the like of components to those described below. Various modifications can be made to the technological idea of the present invention within the technological scope defined by the appended claims.

Embodiment 1

(Configuration of Power Converter)

A power converter 1 including semiconductor devices 2a, 2b, 2c, 2d, 2e, and 2f (hereinafter, the "semiconductor devices 2a, 2b, 2c, 2d, 2e, and 2f" may be abbreviated as the "semiconductor devices 2a to 2f) according to Embodiment 1 of the present invention is described using FIG. 1. The following description uses an inverter circuit as an example of the power converter 1 including the semiconductor devices 2a to 2f according to the present embodiment. However, the semiconductor devices 2a to 2f may also be applied to power converters such as converter circuits and full-bridge circuits.

Figure 1:
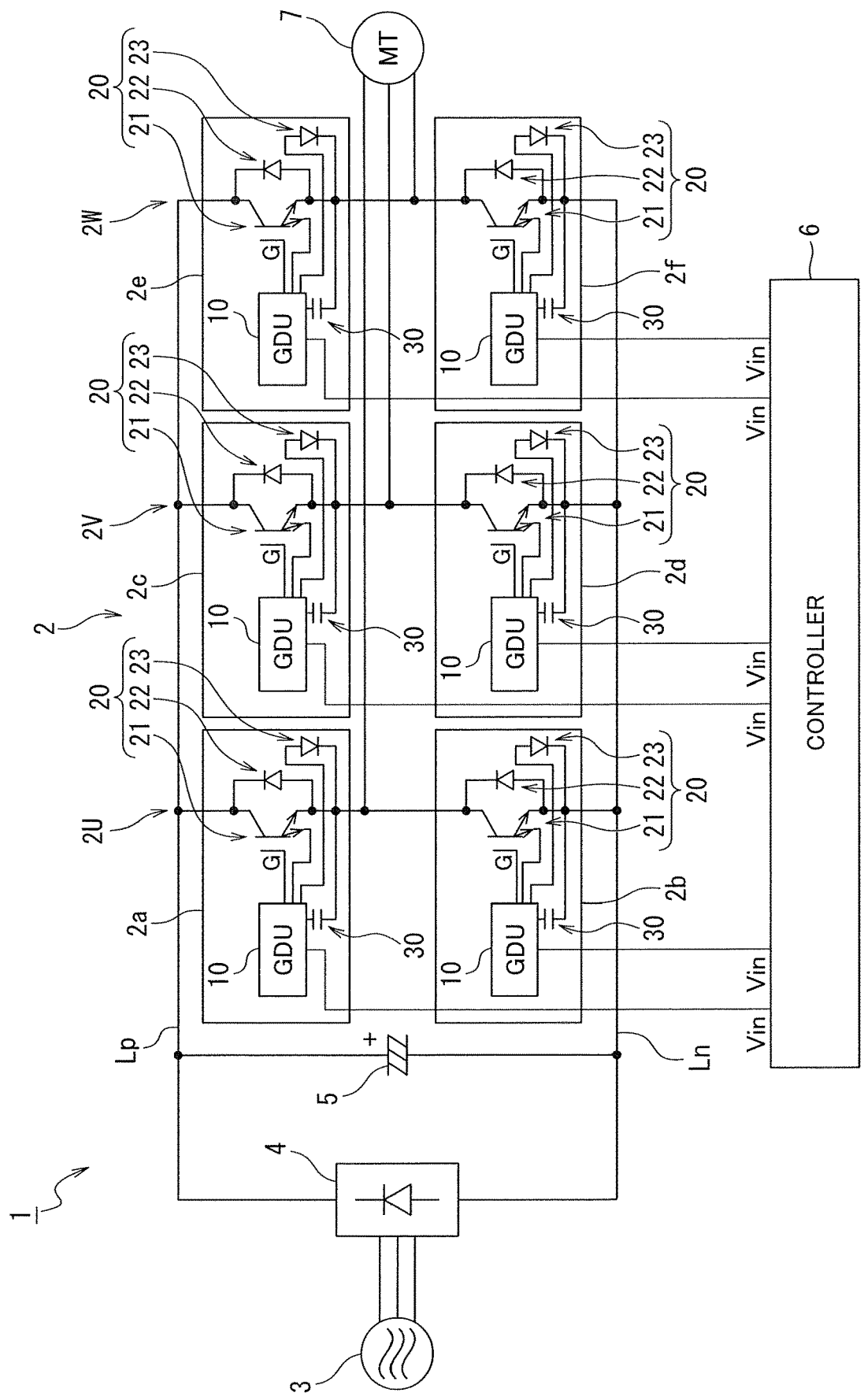
FIG. 1 is a circuit block diagram illustrating a schematic configuration of a power converter including a semiconductor device according to each embodiment of the present invention.

As illustrated in FIG. 1, the power converter 1 is connected to a three-phase AC power supply 3. The power converter 1 includes a rectifier circuit 4 that full-wave rectifies three-phase AC power input from the three-phase AC power supply 3 and a smoothing capacitor 5 that smooths power rectified by the rectifier circuit 4. Although illustration of a specific configuration of the rectifier circuit 4 is omitted, the rectifier circuit 4 is configured by connecting six diodes in a full bridge or by connecting six switching elements in a full bridge.

A positive-side line Lp is connected to a positive output terminal of the rectifier circuit 4, and a negative-side line Ln is connected to a negative output terminal thereof. The smoothing capacitor 5 is connected between the positive-side line Lp and the negative-side line Ln. Additionally, the power converter 1 includes an inverter circuit 2 that converts a DC voltage applied between the positive-side line Lp and the negative-side line Ln into a three-phase AC voltage. The inverter circuit 2 includes semiconductor devices 2a, 2c, and 2e each including an insulated gate bipolar transistor (an example of a switching element) as, for example, a voltage-controlled switching element that forms an upper arm section connected to the positive-side line Lp and semiconductor devices 2b, 2d, and 2f each including an insulated gate bipolar transistor 21 that forms a lower arm section connected to the negative-side line Ln. Hereinafter, the insulated gate bipolar transistor is abbreviated as "IGBT 21".

The IGBT 21 included in the semiconductor device 2a and the IGBT 21 included in the semiconductor device 2b are connected in series between the positive-side line Lp and the negative-side line Ln to form a U-phase output arm 2U. The IGBT 21 included in the semiconductor device 2c and the IGBT 21 included in the semiconductor device 2d are connected in series between the positive-side line Lp and the negative-side line Ln to form a V-phase output arm 2V. The IGBT 21 included in the semiconductor device 2e and the IGBT 21 included in the semiconductor device 2f are connected in series between the positive-side line Lp and the negative-side line Ln to form a W-phase output arm 2W.

A free wheeling diode 22 is connected in anti-parallel to each of the IGBTs 21 included in the semiconductor devices 2a to 2f. Details of the IGBT 21 and the free wheeling diode 22 are described later.

A connection portion between the IGBT 21 included in the semiconductor device 2a and the IGBT 21 included in the semiconductor device 2b, a connection portion between the IGBT 21 included in the semiconductor device 2c and the IGBT 21 included in the semiconductor device 2d, and a connection portion between the IGBT 21 included in the semiconductor device 2e and the IGBT 21 included in the semiconductor device 2f, respectively, are connected to a load, for example, a motor 7.

Each of the semiconductor devices 2a to 2f includes a gate driver circuit 10 that individually controls switching operation of the IGBT 21. In FIG. 1, the gate driver circuit 10 is denoted as "GDU". In each of the semiconductor devices 2a to 2f, output terminals of the gate driver circuits 10 are connected to gates (an example of a control signal input terminal) G of the IGBTs 21, respectively. Additionally, each of the semiconductor devices 2a to 2f includes a gate capacitor (an example of a capacitor) 30 connected to the gate driver circuit 10. Details of the gate driver circuit 10 and the gate capacitor 30 are described later.

The inverter circuit 2 includes a three-phase full-bridge circuit in which the U-phase output arm 2U, the V-phase output arm 2V, and the W-phase output arm 2W are connected in parallel, the semiconductor devices 2a and 2b that control switching operation of the U-phase output arm 2U, the semiconductor devices 2c and 2d that control switching operation of the V-phase output arm 2V, and the semiconductor devices 2e and 2f that control switching operation of the W-phase output arm 2W.

The power converter 1 includes a controller 6 that controls the gate driver circuit 10 provided in each of the semiconductor devices 2a to 2f. The controller 6 is configured to individually output, for example, a pulse-shaped input signal Vin to each gate drive circuit 10 provided in each of the semiconductor devices 2a to 2f. This allows the controller 6 to control the gate driver circuit 10 provided in each of the semiconductor devices 2a to 2f to drive the IGBT 21 provided in each of the semiconductor devices 2a to 2f by, for example, pulse width modulation (PWM).

<Semiconductor Device>

Next, the semiconductor devices according to the present embodiment are described with reference to FIG. 1 and using FIGS. 2 to 6. The semiconductor devices 2a to 2f provided in the power converter 1 have the same configuration and operate in the same manner. Therefore, the semiconductor devices 2a to 2f are described hereinafter using the semiconductor device 2a as an example.

(Configuration of Semiconductor Device)

A schematic configuration of the semiconductor device 2a according to the present embodiment is described with reference to FIG. 1 and using FIG. 2.

Figure 2:
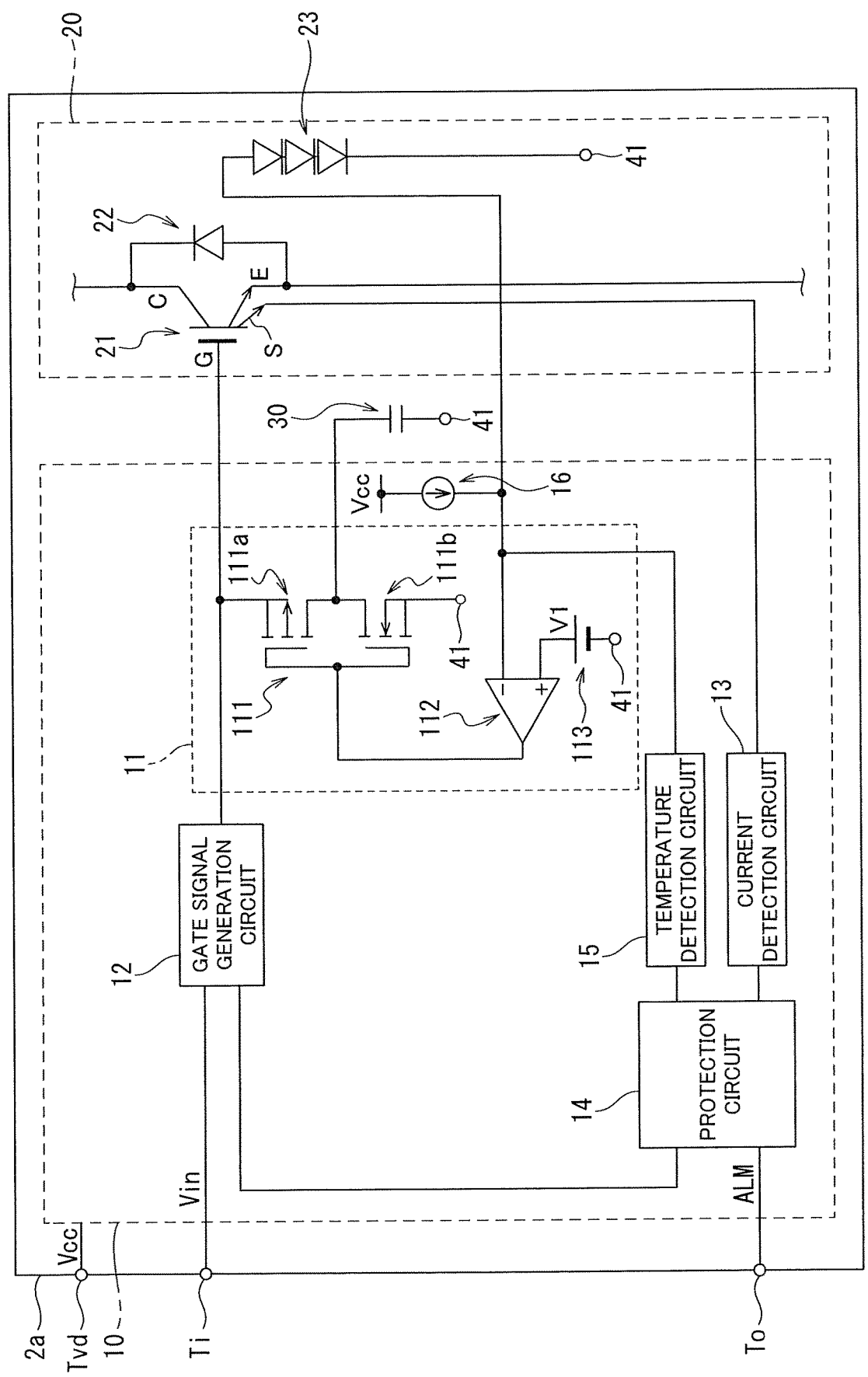
FIG. 2 is a circuit block diagram illustrating a schematic configuration of a semiconductor device according to Embodiment 1 of the present invention.

As illustrated in FIG. 2, the semiconductor device 2a includes the IGBT (an example of a switching element) 21 including a gate (an example of a control signal input terminal) G to which a gate signal (an example of a switching control signal) is input and a current detection terminal S used to detect at least one of overcurrent or short-circuit current. The semiconductor device 2a includes a temperature detection element 23 that detects temperature of the IGBT 21. The semiconductor device 2a includes a capacitance adjustment unit 11 that is arranged between the gate G of the IGBT 21 and a reference potential terminal 41 and that adjusts a capacitance between the gate G and an emitter E of the IGBT 21 according to a detection temperature detected by the temperature detection element 23. A gate capacitor (an example of a capacitor) 30 is arranged between the capacitance adjustment unit 11 and the reference potential terminal 41. The gate capacitor 30 is provided to reduce recovery voltage change rate during switching of the IGBT 21.

The reference potential terminal 41 is connected to an output terminal of the inverter circuit 2 in the semiconductor devices 2a, 2c, and 2e forming the upper arm section of the inverter circuit 2 (see FIG. 1), and is connected to a ground terminal (earth terminal) in the semiconductor devices 2b, 2d, and 2f forming the lower arm section of the inverter circuit 2.

The semiconductor device 2a includes a current detection circuit 13 that detect, as a voltage, a detection current output from the current detection terminal S. The semiconductor device 2a includes a gate signal generation circuit 12 that generates a gate signal to be input to the gate G. The semiconductor device 2a includes a temperature detection circuit 15 that detects temperature of the IGBT 21 on the basis of voltage input from the temperature detection element 23. The semiconductor device 2a includes a protection circuit 14 that protects the IGBT 21 from abnormal operation on the basis of the voltage input from the current detection circuit 13 and voltage input from the temperature detection circuit 15.

The semiconductor device 2a includes a semiconductor substrate (not illustrated), the capacitance adjustment unit 11, the gate signal generation circuit 12, the current detection circuit 13, the protection circuit 14, and the temperature detection circuit 15 formed on the semiconductor substrate, and is provided with the gate driver circuit 10 that controls the IGBT 21. The gate capacitor 30 is connected to the gate driver circuit 10. The semiconductor device 2a includes a printed circuit board (not illustrated) on which the gate driver circuit and the gate capacitor 30 are mounted. The reference potential terminal 41 is formed, for example, on the printed circuit board.

The semiconductor device 2a includes a semiconductor element 20 including the IGBT 21, the free wheeling diode 22 connected in anti-parallel to the IGBT 21, and the temperature detection element 23. A cathode of the free wheeling diode 22 is connected to a collector C of the IGBT 21, and an anode of the free wheeling diode 22 is connected to the emitter E of the IGBT 21. For example, the semiconductor element 20 and the printed circuit board are packaged in one module configuration.

The IGBT 21 is a composite element including a main IGBT through which a main current that is a current to be supplied to the motor 7 flows and a sense IGBT through which a detection current for detecting the current flowing through the main IGBT flows. A gate of the main IGBT and a gate of the sense IGBT are connected to form the gate G of the IGBT 21. A collector of the main IGBT and a collector of the sense IGBT are connected to form the collector C of the IGBT 21. An emitter of the main IGBT is the emitter E of the IGBT 21. An emitter of the sense IGBT is the current detection terminal S of the IGBT 21. The detection current is much smaller than the main current, and has a current amount of, for example, approximately $\frac{1}{10,000}$ of the main current.

The collector C of the IGBT 21 included in each of the semiconductor devices 2a, 2c, and 2e (see FIG. 1) is connected to the positive-side line Lp (see FIG. 1). The emitter E of the IGBT 21 included in the semiconductor device 2a is connected to the collector C of the IGBT 21 included in the semiconductor device 2b (see FIG. 1). The emitter E of the IGBT 21 included in the semiconductor device 2c is connected to the collector C of the IGBT 21 included in the semiconductor device 2d (see FIG. 1). The emitter E of the IGBT 21 included in the semiconductor device 2e is connected to the collector C of the IGBT 21 included in the semiconductor device 2f (see FIG. 1). The emitter E of the IGBT 21 included in each of the semiconductor devices 2b, 2d, and 2f is connected to the negative-side line Ln (see FIG. 1).

As illustrated in FIG. 2, the gate signal generation circuit 12 is connected to a signal input terminal Ti provided in the semiconductor device 2a. The input signal Vin output from the controller 6 is input to the gate signal generation circuit 12 via the signal input terminal Ti. Although a detailed description is omitted, the gate signal generation circuit 12 generates a gate signal (e.g., a pulse signal) at a signal level that can control the IGBT 21 to an ON state (conducting state) or an OFF state (non-conducting state) on the basis of a signal level of the input signal Vin input from the signal input terminal Ti.

Additionally, an output signal output from the protection circuit 14 is input to the gate signal generation circuit 12. When an output signal indicating abnormal operation of the IGBT 21 is input from the protection circuit 14, the gate signal generation circuit 12 generates a gate signal at a signal level that can control the IGBT 21 to the OFF state regardless of the signal level of the input signal Vin, and outputs to the IGBT 21. Here, the abnormal operation of the IGBT 21 means operation in a state where at least one of a current flowing through the IGBT 21 or an operation temperature of the IGBT 21 exceeds an absolute maximum rating.

As illustrated in FIG. 2, an input of the current detection circuit 13 is connected to an output of the current detection terminal S of the IGBT 21, and an output of the current detection circuit 13 is connected to an input of the protection circuit 14. When the detection current input from the current detection terminal S of the IGBT 21 is smaller than an absolute maximum rated current of the IGBT 21, the current detection circuit 13 outputs, for example, an output signal at low signal level to the protection circuit 14. On the other hand, when the detection current input from the current detection terminal S of the IGBT 21 is equal to or larger than the absolute maximum rated current of the IGBT 21, the current detection circuit 13 outputs, for example, an output signal at high signal level to the protection circuit 14. The current detection circuit 13, for example, compares a detection voltage obtained by converting the detection current input from the current detection terminal S of the IGBT 21 into a voltage with a voltage that is preset and higher than a voltage corresponding to the absolute maximum rated current of the IGBT 21 (e.g., 1.5 to 2 times the voltage). This allows the current detection circuit 13 to detect whether or not the current (e.g., collector current) flowing through the IGBT 21 exceeds an operable current amount.

As illustrated in FIG. 2, an input of the temperature detection circuit 15 is connected to an output of the temperature detection element 23. An output of the temperature detection circuit 15 is connected to an input of the protection circuit 14 that is different from that for the output of the current detection circuit 13. A connection portion between the input of the temperature detection circuit 15 and the output of the temperature detection element 23 is connected to an output of a constant current circuit 16 provided in the gate driver circuit 10. The constant current circuit 16 operates at a power supply voltage Vcc applied to a power supply terminal Tvd provided in the semiconductor device 2a, and outputs a constant current having a predetermined value to the temperature detection element 23. The output of the constant current circuit 16 is connected not only to the input of the temperature detection circuit 15 but also to an inverting input terminal (−) of a comparator 112 (see below for details) provided in a switch circuit 111. An input impedance of the temperature detection circuit 15 and an input impedance of the comparator 112 are high impedance. Therefore, the constant current output from the constant current circuit 16 hardly flows through the temperature detection circuit 15 and the comparator 112, but flows through the temperature detection element 23.

As illustrated in FIG. 2, the temperature detection element 23 is composed of a plurality (three in the present embodiment) of diodes connected in series. The diodes are made of, for example, silicon. The temperature detection element 23 is arranged between the temperature detection circuit 15, the constant current circuit 16, and the comparator 112 and the reference potential terminal 41. The temperature detection element 23 is arranged so as to be in a forward direction from the constant current circuit 16 side toward the reference potential terminal 41 side. Therefore, among the plurality of diodes forming the temperature detection element 23, the diode arranged on the constant current circuit 16 side has an anode connected to the input of the temperature detection circuit 15, the output of the constant current circuit 16, and the input of the comparator 112. Among the plurality of diodes forming the temperature detection element 23, the diode arranged on the reference potential terminal 41 side has a cathode connected to the reference potential terminal 41.

In general, the forward voltage of a silicon diode is lower at higher ambient temperature than at lower ambient temperature. Therefore, when constant current is input from the constant current circuit 16 to the temperature detection element 23, voltage drop in the temperature detection element 23 becomes smaller as the temperature of the IGBT 21 increases. As a result, the voltage input from the temperature detection element 23 to the temperature detection circuit 15 decreases as the temperature of the IGBT 21 increases. Accordingly, the temperature detection circuit 15 can detect whether or not the temperature of the IGBT 21 exceeds the absolute maximum rating by using the voltage that is input from the temperature detection element 23 and changes according to the temperature of the IGBT 21.

When the temperature detected by the temperature detection element 23 is lower than a value set on the basis of the absolute maximum rated temperature of the IGBT 21, the temperature detection circuit 15 outputs, for example, an output signal at low signal level to the protection circuit 14. On the other hand, when the temperature detected by the temperature detection element 23 is equal to or higher than the value set on the basis of the absolute maximum rated temperature of the IGBT 21, the temperature detection circuit 15 outputs, for example, an output signal at high signal level to the protection circuit 14. The temperature detection circuit 15, for example, compares a value input from the temperature detection element 23 with a value that is preset and set on the basis of the absolute maximum rated temperature of the IGBT 21. This allows the temperature detection circuit 15 to detect whether or not the temperature of the IGBT 21 is an operable temperature.

As illustrated in FIG. 2, the protection circuit 14 includes two outputs. One output of the protection circuit 14 is connected to an input of the gate signal generation circuit 12 that is different from that for the input signal Vin. The other output of the protection circuit 14 is connected to a signal output terminal To provided in the semiconductor device 2a.

When an output signal indicating that a current exceeding an operable range is flowing through the IGBT 21 (hereinafter may be referred to as "current abnormality signal") is input from the current detection circuit 13, the protection circuit 14 outputs a signal indicating the abnormal state of the IGBT 21 to the gate signal generation circuit 12. When the current abnormality signal is input from the current detection circuit 13, the gate signal generation circuit 12 outputs a gate signal capable of turning off the IGBT 21 to the gate G of the IGBT 21 to stop the operation of the IGBT 21 at the current exceeding the operable range. Additionally, when the current abnormality signal is input from the current detection circuit 13, the protection circuit 14 outputs an alarm signal ALM (e.g., a signal at high signal level) to the signal output terminal To. This allows the semiconductor device 2a to output the alarm signal ALM indicating that the IGBT 21 is in the abnormal state to the controller 6 (see FIG. 1).

When an output signal indicating that the IGBT 21 is operating at a temperature exceeding an operable temperature (hereafter may be referred to as "temperature abnormality signal") is input from the temperature detection circuit 15, the protection circuit 14 outputs a signal indicating the abnormal state of the IGBT 21 to the gate signal generation circuit 12. When the temperature abnormality signal is input from the temperature detection circuit 15, the gate signal generation circuit 12 outputs a gate signal capable of turning off the IGBT 21 to the gate G of the IGBT 21 to stop the operation of the IGBT 21 at the temperature exceeding the operable range. Additionally, when the temperature abnormality signal is input from the temperature detection circuit 15, the protection circuit 14 outputs the alarm signal ALM (e.g. a signal at high signal level) to the signal output terminal To. This allows the semiconductor device 2a to output the alarm signal ALM indicating that the IGBT 21 is in the abnormal state to the controller 6 (see FIG. 1).

The protection circuit 14 may be configured to output different alarm signals ALM to the signal output terminal To when a current abnormality signal is input from the current detection circuit 13 and when a temperature abnormality signal is input from the temperature detection circuit 15. When a current abnormality signal is input from the current detection circuit 13, the protection circuit 14 may output, for example, the alarm signal ALM at high signal level to the signal output terminal To. On the other hand, when a temperature abnormality signal is input from the temperature detection circuit 15, the protection circuit 14 may output, for example, a pulsed alarm signal ALM to the signal output terminal To. When neither a current abnormality signal nor a temperature abnormality signal is input (i.e., when the IGBT 21 is in a normal operation state), the protection circuit 14 outputs, for example, the alarm signal ALM at low signal level to the signal output terminal To. This allows the controller 6 to determine the operation state of the IGBT 21 on the basis of the alarm signal ALM input from the semiconductor device 2a.

As illustrated in FIG. 2, the capacitance adjustment unit 11 includes the switch circuit 111 that disconnects the connection between the gate G of the IGBT 21 and the gate capacitor 30 when a detection temperature detected by the temperature detection element 23 is equal to or higher than a predetermined comparison temperature and that connects the gate G of the IGBT 21 and the gate capacitor 30 when the detection temperature is lower than the comparison temperature. In the present embodiment, the comparison temperature is set to, for example, a temperature based on the absolute maximum rated temperature as the operable temperature of the IGBT 21 (a temperature equal to or lower than the absolute maximum rated temperature). The capacitance adjustment unit 11 includes the comparator (an example of a comparator portion) 112 that compares a detection voltage corresponding to the detection temperature input from the temperature detection element 23 and detected by the temperature detection element 23 with a comparison voltage V1 corresponding to the comparison temperature. The capacitance adjustment unit 11 includes a voltage generation portion 113 that generates the comparison voltage V1.

The switch circuit 111 includes, for example, a P-type MOS transistor 111a (an example of a disconnection switch) provided so as to be able to disconnect the connection between the gate G of the IGBT 21 and the gate capacitor 30. The switch circuit 111 includes, for example, an N-type MOS transistor 111b (an example of a connection switch) provided so as to be able to discharge electric charge of the gate capacitor 30.

The MOS transistor 111a and the MOS transistor 111b have a complementary configuration in which they are connected in series between the gate G of the IGBT 21 and the reference potential terminal 41. Therefore, the switch circuit 111 is a complementary switch circuit composed of the MOS transistors 111a and 111b. Accordingly, the capacitance adjustment unit 11 includes the complementary switch circuit.

A source of the MOS transistor 111a is connected to the gate G of the IGBT 21. A drain of the MOS transistor 111a is connected to a drain of the MOS transistor 111b. A source of the MOS transistor 111b is connected to the reference potential terminal 41.

A gate of the MOS transistor 111a and a gate of the MOS transistor 111b are connected. An output terminal of the comparator 112 provided in the capacitance adjustment unit 11 is connected to the gate of the MOS transistor 111a and the gate of the MOS transistor 111b. The gate capacitor 30 is connected to the drain of the MOS transistor 111a and the drain of the MOS transistor 111b. A connection portion between the gate of the MOS transistor 111a and the gate of the MOS transistor 111b is an input terminal of the switch circuit 111. Therefore, the comparator 112 is arranged on an input side of the switch circuit 111. A connection portion between the drain of the MOS transistor 111a and the drain of the MOS transistor 111b is an output terminal of the switch circuit 111. Therefore, the gate capacitor 30 is arranged on an output side of the switch circuit 111.

One electrode of the gate capacitor 30 is connected to the drain of the MOS transistor 111a and the drain of the MOS transistor 111b. The other electrode of the gate capacitor 30 is connected to the reference potential terminal 41. Therefore, the gate capacitor 30 is arranged between the output terminal of the switch circuit 111 and the reference potential terminal 41 with the one electrode connected to the output terminal of the switch circuit 111.

Figure 3:
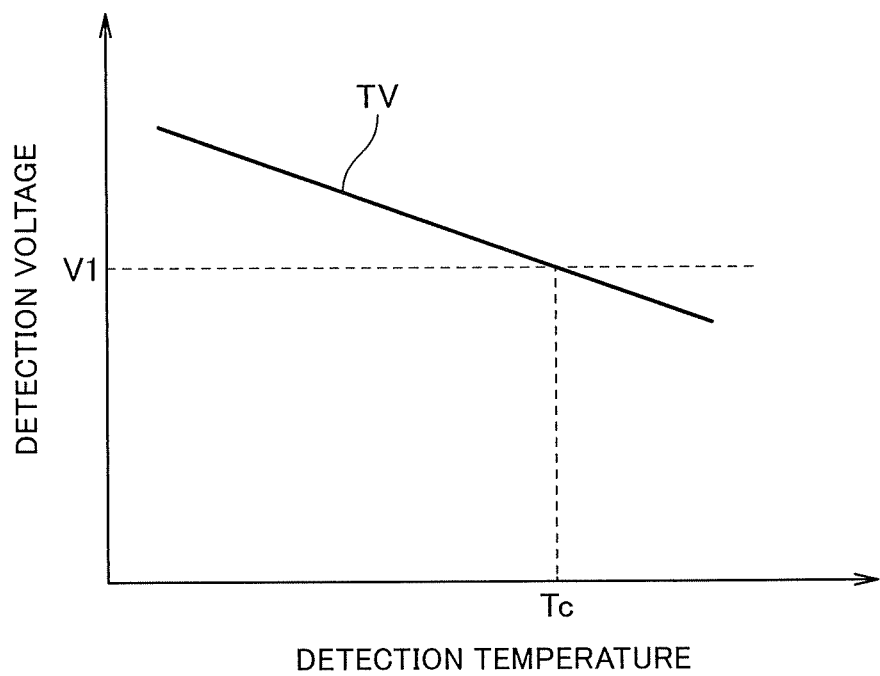
FIG. 3 is a diagram illustrating an example of a relationship between a detection temperature and a detection voltage in a temperature detection element included in the semiconductor device according to Embodiment 1 of the present invention.
Figure 4:
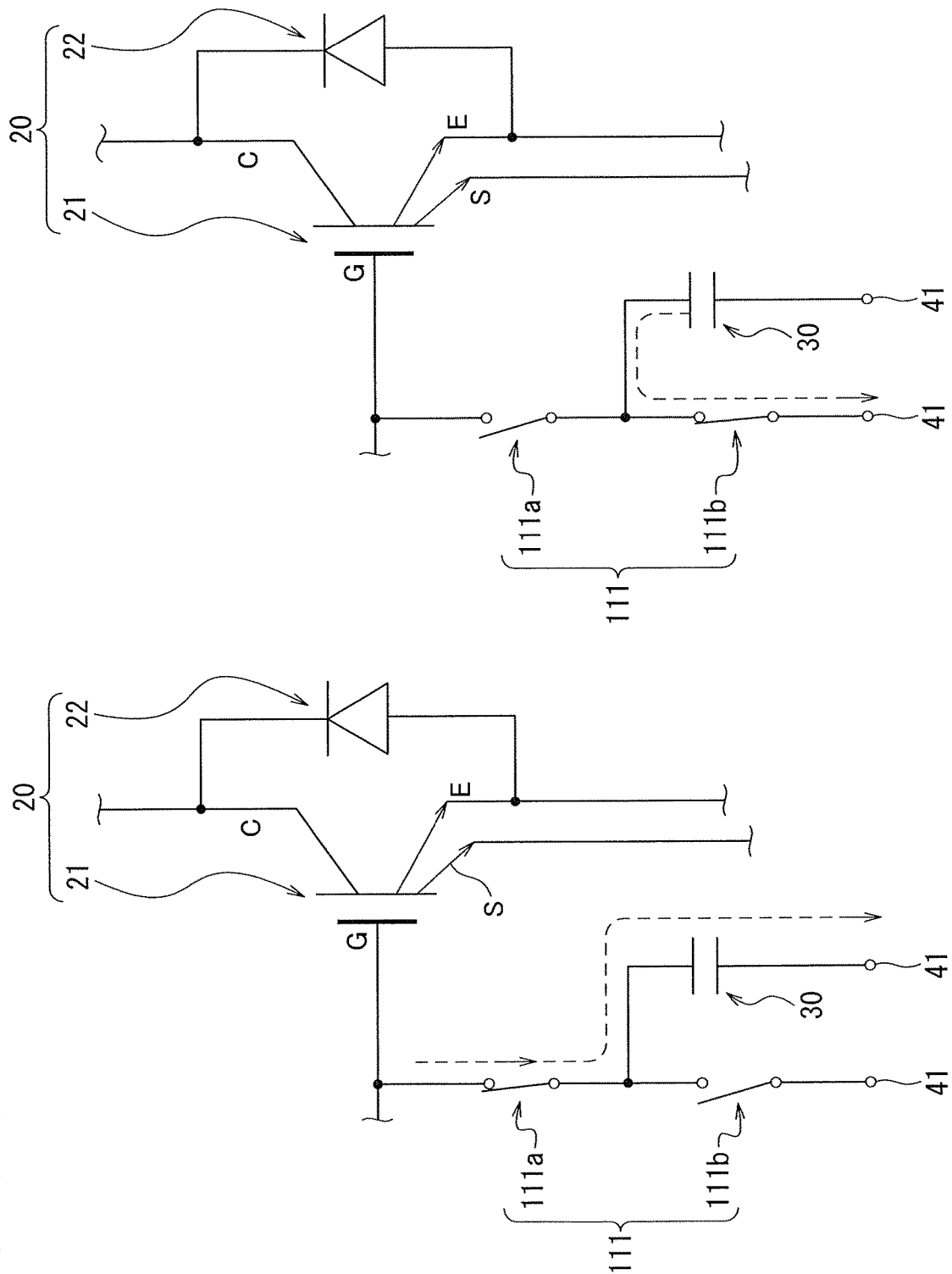
FIGS. 4A and 4B are diagrams illustrating an example of operation of a capacitance adjustment unit included in the semiconductor device according to Embodiment 1 of the present invention.

FIG. 3 is a diagram illustrating an example of a relationship between detection temperature and detection voltage in the temperature detection element 23. The horizontal axis of a graph illustrated in FIG. 3 represents the detection temperature detected by the temperature detection element 23. The vertical axis of the graph illustrated in FIG. 3 represents the detection voltage corresponding to the detection temperature detected by the temperature detection element 23. The "TV" illustrated in FIG. 3 indicates characteristics of the detection voltage with respect to the detection temperature of the temperature detection element 23 (temperature-voltage characteristics).

As described above, the temperature detection element 23 has characteristics in which the detection voltage decreases, for example, linearly as the detection temperature increases. Therefore, as illustrated in FIG. 3, the temperature detection element 23 has temperature-voltage characteristics TV that decline rightward. In the semiconductor device 2a, a comparison temperature Tc is set that is based on the absolute maximum rated temperature of the IGBT 21 in the temperature-voltage characteristics TV. Accordingly, when the detection temperature detected by the temperature detection element 23 is lower than the comparison temperature Tc, the detection voltage is higher than the comparison voltage V1. On the other hand, when the detection temperature detected by the temperature detection element 23 is equal to or higher than the comparison temperature Tc, the detection voltage is equal to or lower than the comparison voltage V1.

In the present embodiment, the comparison temperature Tc is set on the basis of the operable maximum temperature (absolute maximum rated temperature) of the IGBT 21. Accordingly, when the detection temperature detected by the temperature detection element 23 is lower than the comparison temperature Tc set on the basis of the absolute maximum rated temperature of the IGBT 21, the detection voltage is higher than the comparison voltage V1. On the other hand, when the detection temperature detected by the temperature detection element 23 is equal to or higher than the comparison temperature Tc, the detection voltage is equal to or lower than the comparison voltage V1.

Returning to FIG. 2, the voltage generation portion 113 is composed of, for example, a DC power supply. A negative side of the voltage generation portion 113 is connected to the reference potential terminal 41. The comparison voltage V1 is set on the basis of a voltage corresponding to the absolute maximum rated temperature of the IGBT 21.

As illustrated in FIG. 2, the comparator 112 is, for example, a hysteresis comparator composed of an operational amplifier and an unillustrated resistance element. The temperature detection element 23 is connected to an inverting input terminal (−) of the comparator 112, and a positive side of the voltage generation portion 113 is connected to a non-inverting input terminal (+) of the comparator 112. The output terminal of the comparator 112 is connected to the respective gates of the MOS transistor 111a and the MOS transistor 111b provided in the switch circuit 111.

When the detection voltage input from the temperature detection element 23 and corresponding to the detection temperature is higher than the comparison voltage V1 generated by the voltage generation portion 113, the comparator 112 outputs, for example, a signal at low signal level to the switch circuit 111. Additionally, when the detection voltage input from the temperature detection element 23 is equal to or lower than the comparison voltage V1 (i.e., when the comparison voltage V1 or lower), the comparator 112 outputs, for example, an output signal at high signal level to the switch circuit 111. Accordingly, when the detection temperature detected by the temperature detection element 23 is equal or higher than the comparison temperature Tc, the comparator 112 outputs a high-level output signal. On the other hand, when the detection temperature detected by the temperature detection element 23 is lower than the comparison temperature Tc, the comparator 112 outputs a low-level output signal.

Since the MOS transistor 111a is composed of a P-type MOS, it is turned off (non-conducting state) when the output signal output by the comparator 112 is at high level, and is turned on (conducting state) when the output signal is at low level. Therefore, when the detection temperature detected by the temperature detection element 23 is equal to or higher than the comparison temperature Tc (when the output signal of the comparator 112 is at high level), the MOS transistor 111a disconnects the connection between the gate G of the IGBT 21 and the gate capacitor 30 (more specifically, an electrical connection thereof with the one electrode of the gate capacitor 30). On the other hand, when the detection temperature detected by the temperature detection element 23 is lower than the comparison temperature Tc (when the output signal of the comparator 112 is at low level), the MOS transistor 111a connects the gate G of the IGBT 21 and the gate capacitor 30 (more specifically, electrically connects the gate G and the one electrode of the gate capacitor 30).

Since the MOS transistor 111b is composed of an N-type MOS, it is turned on (conducting state) when the output signal output by the comparator 112 is at high level, and is turned off (non-conducting state) when the output signal is at low level. Therefore, when the detection temperature detected by the temperature detection element 23 is equal to or higher than the comparison temperature Tc (when the output signal of the comparator 112 is at high level), the MOS transistor 111b connects the reference potential terminal 41 and the gate capacitor 30 (more specifically, electrically connects the reference potential terminal 41 and the one electrode of the gate capacitor 30). Additionally, when the detection temperature detected by the temperature detection element 23 is lower than the comparison temperature Tc (when the output signal of the comparator 112 is at low level), the MOS transistor 111b disconnects the reference potential terminal 41 from the gate capacitor 30 (more specifically, electrically disconnects the reference potential terminal 41 from the one electrode of the gate capacitor 30).

Additionally, in other words, when the comparator 112 outputs a signal indicating that the detection voltage corresponding to the detection temperature detected by the temperature detection element 23 is equal to or lower than the comparison voltage V1 corresponding to the comparison temperature Tc, the MOS transistor 111a disconnects the connection between the gate capacitor 30 and the gate G of the IGBT 21 (more specifically, the electrical connection between the one electrode of the gate capacitor 30 and the gate G of the IGBT 21), and the MOS transistor 111b connects the gate capacitor 30 to the reference potential terminal 41 (more specifically, electrically connects the one electrode of the gate capacitor 30 to the reference potential terminal 41). On the other hand, when the comparator 112 outputs a signal indicating that the detection voltage detected by the temperature detection element 23 is higher than the comparison voltage V1, the MOS transistor 111a does not disconnect the connection between the gate capacitor 30 and the gate G (more specifically, the electrical connection between the one electrode of the gate capacitor 30 and the gate G), and the MOS transistor 111b disconnects the gate capacitor 30 from the reference potential terminal 41 (more specifically, electrically disconnects the one electrode of the gate capacitor 30 from the reference potential terminal 41).

Accordingly, when the detection temperature detected by the temperature detection element 23 is equal to or higher than the comparison temperature Tc (when the detection voltage corresponding to the detection temperature is equal to or lower than the comparison voltage V1 corresponding to the comparison temperature Tc), the switch circuit 111 serves to switch to a circuit configuration for discharging the electric charge of the gate capacitor 30. In other words, the switch circuit 111 connects the gate capacitor 30 to the reference potential terminal 41 when the detection temperature detected by the temperature detection element 23 is equal to or higher than the comparison temperature Tc. The comparison temperature Tc is set on the basis of, for example, the operable maximum temperature (absolute maximum rated temperature) of the IGBT 21, (e.g., set to equal to or lower than the absolute maximum rated temperature). Additionally, in this case, the switch circuit 111 disconnects the connection between the gate G of the IGBT 21 and the gate capacitor 30 (more specifically, the electrical connection between the gate G of the IGBT 21 and the one electrode of the gate capacitor 30). In addition, when the detection temperature detected by the temperature detection element 23 is lower than the comparison temperature (when the detection voltage is higher than the comparison voltage V1), the switch circuit 111 disconnects the gate capacitor 30 from the reference potential terminal 41 (more specifically, electrically disconnects the one electrode of the gate capacitor 30 from the reference potential terminal 41). Furthermore, in this case, the switch circuit 111 connects the gate G of the IGBT 21 to the gate capacitor 30 (more specifically, electrically connects the gate G of the IGBT 21 to the one electrode of the gate capacitor 30).

Although details are described later, the semiconductor devices 2a to 2f control the switch circuit 111 according to the temperature of the IGBT 21, and disconnect the connection between the gate G of the IGBT 21 and the gate capacitor 30 when the IGBT 21 is higher than the comparison temperature Tc, thereby enabling loss in the IGBT 21 at high temperature to be suppressed without increasing radiation noise of the IGBT 21.

(Operation of Semiconductor Device)

Operation of the semiconductor device 2a according to the present embodiment is described with reference to FIGS. 1 to 3 and using FIGS. 4A and 4B. FIGS. 4A and 4B are a diagram illustrating operation of the capacitance adjustment unit 11. In FIGS. 4A and 4B, the MOS transistors 111a and 111b are illustrated by circuit symbols of switches to facilitate understanding of the open and closed states. FIG. 4A is a circuit diagram of the capacitance adjustment unit 11 and the like in which the MOS transistor 111a is in an ON state (conducting state) and the MOS transistor 111b is in an OFF state (non-conducting state). FIG. 4B is a circuit diagram of the capacitance adjustment unit 11 and the like in which the MOS transistor 111a is in an OFF state (non-conducting state) and the MOS transistor 111b is in an ON state (conducting state).

(Normal Operation)

Assume that when there is no overcurrent or short-circuit current flowing between the collector C and the emitter E (see FIG. 2) of the IGBT 21 and the IGBT 21 operates in an operable temperature range (hereinafter may be referred to as "normal state"), the input signal Vin at, for example, high signal level is input from the controller 6 (see FIG. 1). In this case, the gate signal generation circuit 12 (see FIG. 1)

provided in the semiconductor device 2a is in a non-operation state, and outputs no gate signal to the gate G of the IGBT 21. Therefore, the IGBT 21 is turned off. As a result, no current flows between the collector C and the emitter E of the IGBT 21, so that no detection current also flows from the current detection terminal S (see FIG. 2). Additionally, since the temperature of the IGBT 21 remains, for example, at room temperature, the temperature detection element 23 detects a temperature lower than the comparison temperature Tc.

When the IGBT 21 is in the normal state and the gate signal generation circuit 12 outputs no gate signal to the gate G of the IGBT 21, no detection current is output from the current detection terminal S of the IGBT 21. Therefore, the current detection circuit 13 (see FIG. 2) outputs an output signal indicating that the IGBT 21 is in the normal operation state to the gate signal generation circuit 12.

When the temperature of the IGBT 21 is at room temperature, the detection voltage output from the temperature detection element 23 is a voltage corresponding to a temperature lower than the absolute maximum rated temperature of the IGBT 21. Therefore, the temperature detection circuit 15 (see FIG. 2) outputs an output signal indicating that the IGBT 21 is in the normal operation state to the gate signal generation circuit 12.

When the temperature of the IGBT 21 is at room temperature, the detection voltage output from the temperature detection element 23 is a voltage corresponding to a temperature lower than the comparison temperature Tc and is higher than the comparison voltage V1. Therefore, the comparator 112 provided in the capacitance adjustment unit 11 outputs an output signal at low signal level to the switch circuit 111 (see FIG. 2). This causes the switch circuit 111 to electrically connect the gate G of the IGBT 21 and the one electrode of the gate capacitor 30 and electrically disconnect the reference potential terminal 41 from the one electrode of the gate capacitor 30.

When the input signal Vin at low signal level is input from the controller 6 in the normal state where no overcurrent or short-circuit current flows between the collector C and the emitter E of the IGBT 21 and the IGBT 21 operates in the operable temperature range, the gate signal generation circuit 12 goes into operation and outputs, for example, a gate signal at high signal level to the IGBT 21. As a result, the IGBT 21 switches from the OFF state to the ON state, whereby a collector-emitter current flows between the collector C and the emitter E. In addition, a detection current having a predetermined current amount based on the collector-emitter current flows from the current detection terminal S of the IGBT 21 to the current detection circuit 13.

Since it is the normal state where no overcurrent or short-circuit current flows between the collector C and the emitter E of the IGBT 21, the detection current output from the current detection terminal S of the IGBT 21 in this case has a current amount based on the current flowing through the IGBT 21 in the normal state. Therefore, the current detection circuit 13 outputs an output signal indicating that the IGBT 21 is in the normal operation state to the gate signal generation circuit 12.

Ambient temperature of the IGBT 21 is almost equal to or higher than room temperature since current flows through the IGBT 21. However, during the normal operation of the IGBT 21, the ambient temperature of the IGBT 21 does not rise to the absolute maximum rated temperature of the IGBT 21. Therefore, the temperature detection element 23 detects a temperature lower than the comparison temperature Tc. As a result, the temperature detection circuit 15 outputs an output signal indicating that the IGBT 21 is in the normal operation state to the gate signal generation circuit 12.

When the IGBT 21 is in the normal state, the current detection circuit 13 and the temperature detection circuit 15 output an output signal indicating that the IGBT 21 is in the normal state to the gate signal generation circuit 12. Therefore, the gate signal generation circuit 12 continues to output a gate signal for transitioning the IGBT 21 from the OFF state to the ON state or for maintaining the ON state to the gate G of the IGBT 21.

The temperature (i.e., the ambient temperature) of the IGBT 21 during the normal operation of the IGBT 21 is lower than the absolute maximum rated temperature. Therefore, the detection voltage output from the temperature detection element 23 is a voltage corresponding to a temperature lower than the comparison temperature Tc and is higher than the comparison voltage V1. This causes the comparator 112 provided in the capacitance adjustment unit 11 to output an output signal at low signal level to the switch circuit 111. As a result, as illustrated in FIG. 4A, the MOS transistor 111a is turned on, and the MOS transistor 111b is turned off. Thus, the switch circuit 111 connects the gate G of the IGBT 21 and the gate capacitor 30, and disconnects the reference potential terminal 41 from the gate capacitor 30.

The gate signal generation circuit 12 outputs a gate current to the gate G when transitioning the IGBT 21 from the OFF state to the ON state. By connecting the gate G of the IGBT 21 and the gate capacitor 30, a part of the gate current flows from the gate signal generation circuit 12 to charge the gate capacitor 30, as indicated by a dashed arrow in FIG. 4A. As a result, the IGBT 21 is maintained at a predetermined potential even after transition from the OFF state to the ON state, and thus can maintain the ON state.

Thus, the semiconductor devices 2a to 2f can connect the gate G of the IGBT 21 and the gate capacitor 30 when the temperature of the IGBT 21 is lower than the absolute maximum rated temperature and the IGBT 21 transitions from an OFF state to an ON state (turned on). This enables the semiconductor devices 2a to 2f to reduce the recovery voltage change rate of the IGBT 21 when the IGBT 21 is turned on, thereby enabling suppression of radiation noise radiated by the IGBT 21.

(Operation at High Temperature)

When the IGBT 21 transitions from the OFF state to the ON state (turned on) at a temperature equal to or higher than the comparison temperature Tc, the temperature detection element 23 detects a temperature equal to or higher than the comparison temperature Tc. Therefore, the temperature detection element 23 outputs a detection voltage based on the detection temperature to the non-inverting input terminal (+) of the comparator 112 provided in the capacitance adjustment unit 11. The detection voltage input to the comparator 112 is a voltage lower than the comparison voltage V1. Therefore, the comparator 112 outputs an output signal at high signal level to the switch circuit 111. This turns off the MOS transistor 111a and turns on the MOS transistor 111b, as illustrated in FIG. 4B. As a result, the switch circuit 111 disconnects the electrical connection between the gate G of the IGBT 21 and the gate capacitor 30, and electrically connects the reference potential terminal 41 and the gate capacitor 30. When the gate capacitor 30 is charged, the electric charge charged in the gate capacitor 30 is discharged to the reference potential terminal 41 via the MOS transistor 111b, as illustrated by a dashed arrow in FIG. 4B.

Thus, the semiconductor devices 2a to 2f disconnect the electrical connection between the gate G of the IGBT 21 and the gate capacitor 30 when the temperature of the IGBT 21 is equal to or higher than the comparison temperature Tc. As a result, although details are described later, the semiconductor devices 2a to 2f can reduce loss in the IGBT 21 when the IGBT 21 is turned on.

<Effects of Semiconductor Device>

Figure 5:
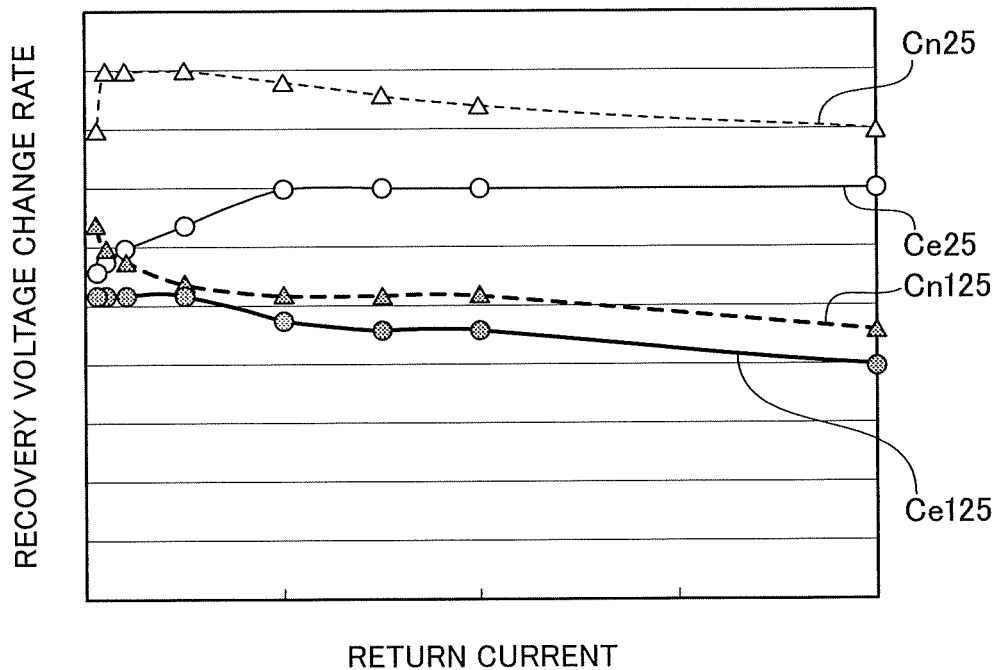
FIG. 5 is a diagram illustrating an example of a relationship between return current and recovery voltage change rate in the semiconductor device according to Embodiment 1 of the present invention.
Figure 6:
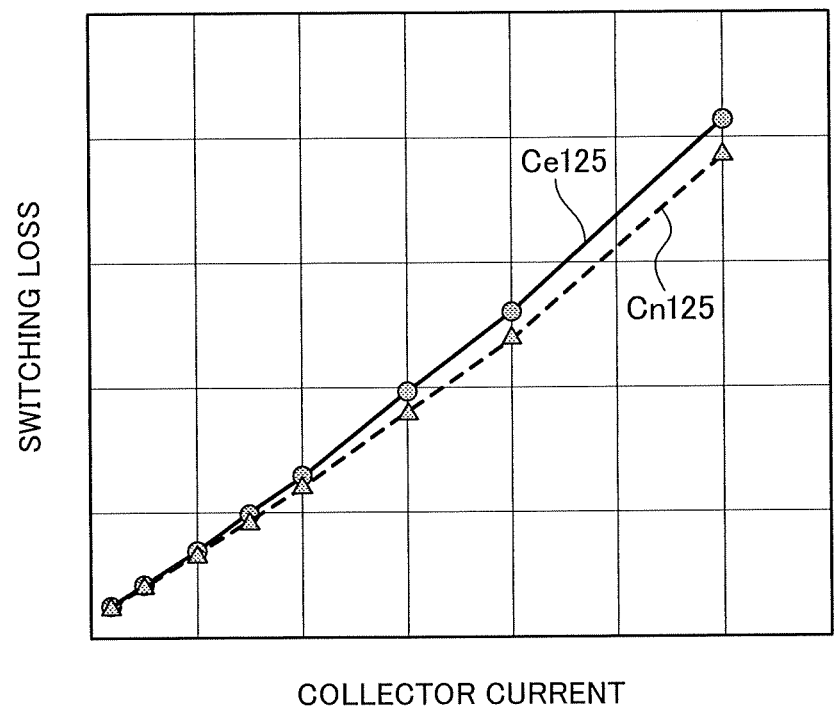
FIG. 6 is a diagram illustrating an example of a relationship between collector current and switching loss in an IGBT included in the semiconductor device according to Embodiment 1 of the present invention.

Next, effects of the semiconductor devices according to the present embodiment are described using the semiconductor device 2a as an example, with reference to FIGS. 2 to 4A, 4B and using FIGS. 5 and 6. FIG. 5 is a diagram illustrating a relationship between a return current flowing through a free wheeling diode connected in anti-parallel to an IGBT and a voltage change rate when the free wheeling diode (FWD) performs reverse recovery operation. For example, when focusing on the semiconductor device 2a and the semiconductor device 2b, a graph illustrated in FIG. 5 is obtained by a measured value of a return current flowing through the free wheeling diode 22 included in the semiconductor device 2b when the IGBT 21 included in the semiconductor device 2a is turned on and a measured value of its voltage change rate. However, the semiconductor device used to obtain the graph illustrated in FIG. 5 does not include the capacitance adjustment unit 11 included in the semiconductor devices 2a to 2f.

The horizontal axis of the graph illustrated in FIG. represents the return current, and the vertical axis of the graph illustrated in FIG. 5 represents the recovery voltage change rate. "Cn25" indicated by connecting white triangles with a dashed line in FIG. 5 indicates the characteristics of the recovery voltage change rate with respect to the return current when a gate capacitor is not provided and the temperature of the IGBT is 25° C. "Ce25" indicated by connecting white circles with a solid line in FIG. 5 indicates the characteristics of the recovery voltage change rate with respect to the return current when a gate capacitor is provided and the temperature of the IGBT is 25° C. "Cn125" indicated by connecting hatched triangles with a dashed line in FIG. 5 indicates the characteristics of the recovery voltage change rate with respect to the return current when a gate capacitor is not provided and the temperature of the IGBT is 125° C. "Ce125" indicated by connecting hatched circles with a solid line in FIG. 5 indicates the characteristics of the recovery voltage change rate with respect to the return current when a gate capacitor is provided and the temperature of the IGBT is 125° C. In the characteristics Ce25 and the characteristics Ce125, the semiconductor devices are provided with a gate capacitor having the same capacitance value.

On the horizontal axis of the graph illustrated in FIG. 5, the return current increases from left to right. On the vertical axis of the graph illustrated in FIG. 5, the recovery voltage change rate increases from bottom to top. Here, the configuration "not having a gate capacitor" means a configuration in which a gate capacitor is not connected to the gate of the IGBT. Additionally, the configuration "having a gate capacitor" means a configuration in which a gate capacitor is connected between the gate of the IGBT and the reference potential terminal.

FIG. 6 is a diagram illustrating a relationship between a collector current flowing through the IGBT at a temperature of 125° C. and a switching loss in the IGBT. FIG. 6 illustrates a graph obtained from measured values of the collector current and switching loss in the IGBT. The horizontal axis of the graph illustrated in FIG. 6 represents the collector current flowing through the IGBT. The vertical axis of the graph illustrated in FIG. 6 represents the switching loss in the IGBT. The switching loss in the IGBT illustrated here is a combined loss of a loss during a transition of the IGBT from the OFF state to the ON state and a loss during reverse recovery of the free wheeling diode (FWD). The characteristics Cn125 have the same content as the characteristics Cn125 in FIG. 5, and the characteristics Ce125 have the same content as the characteristics Ce125 in FIG. 5. On the horizontal axis of the graph illustrated in FIG. 6, the collector current increases from left to right. On the vertical axis of the graph illustrated in FIG. 6, the switching loss increases from bottom to top.

As illustrated in FIG. 5, a comparison between the characteristics Cn25 and the characteristics Cn125 or a comparison between the characteristics Ce25 and the characteristics Ce125 shows that the recovery voltage change rate of the IGBT is higher at low IGBT temperature than at high IGBT temperature. Additionally, a comparison between the characteristics Cn25 and the characteristics Ce25 or a comparison between the characteristics Cn125 and the characteristics Ce125 shows that the recovery voltage change rate of the IGBT is higher when the semiconductor device does not include a gate capacitor than when it includes a gate capacitor. Accordingly, the recovery voltage change rate of the IGBT is maximum when the semiconductor device does not include a gate capacitor and the temperature of the IGBT is lowest (25° C. in FIG. 5). Radiation noise emitted from the IGBT becomes larger as the recovery voltage change rate of the IGBT becomes higher. Therefore, the radiation noise emitted from the IGBT is maximum when the semiconductor device does not include a gate capacitor and the temperature of the IGBT is lowest (25° C. in FIG. 5).

Additionally, the comparison between the characteristics Cn25 and the characteristics Ce25 or the comparison between the characteristics Cn125 and the characteristics Ce125 shows that the gate capacitor has the effect of reducing the recovery voltage change rate of the IGBT. Therefore, the gate capacitor has the effect of suppressing radiation noise of the IGBT. Accordingly, the radiation noise of the IGBT is greater when the IGBT is at low temperature than when at high temperature.

As illustrated in FIG. 6, the switching loss in the IGBT is reduced by 3% to 8% without the gate capacitor than with the gate capacitor. Although illustration is omitted, the switching loss in the IGBT is reduced without the gate capacitor than with the gate capacitor even at other temperatures.

Incidentally, the radiation noise of the IGBT can cause malfunction of other electronic components forming the semiconductor device and equipment arranged around the semiconductor device. Therefore, a semiconductor device including an IGBT requires reduction of radiation noise of the IGBT within a temperature range where the IGBT can operate. It is thus desirable for the semiconductor device to include a gate capacitor capable of reducing radiation noise of the IGBT even when the IGBT is at low temperature (25° C. in FIG. 5).

However, when a semiconductor device includes a gate capacitor that can effectively reduce radiation noise generated at low IGBT temperature, loss generally increases compared to when including a gate capacitor that can effectively reduce radiation noise generated at high IGBT temperature. Furthermore, regardless of IGBT temperature, IGBT loss generally increases when the semiconductor device includes a gate capacitor than when not including a gate capacitor. Accordingly, a semiconductor device that includes a gate capacitor capable of effectively reducing radiation noise generated at low IGBT temperature cannot effectively reduce noise and loss in the IGBT at high IGBT temperature.

On the other hand, the semiconductor devices 2a to 2f according to the present embodiment includes the capacitance adjustment unit 11. Therefore, even when the semiconductor devices 2a to 2f include the gate capacitor 30 whose capacitance value is adjusted so as to be able to effectively reduce radiation noise generated when the IGBT 21 is at low temperature, the electrical connection between the gate capacitor 30 and the gate G of the IGBT 21 can be disconnected when the IGBT 21 is in a high temperature state. This enables the semiconductor devices 2a to 2f to obtain the effect of reducing radiation noise of the IGBT 21 (i.e., the effect of reducing the recovery voltage change rate of the IGBT 21) and also suppress loss generated from the IGBT at high temperature (generated loss).

As described above, the semiconductor devices 2a to 2f according to the present embodiment includes the IGBT 21 including the gate G to which a gate signal is input, the temperature detection element 23 that detects temperature of the IGBT 21, and the capacitance adjustment unit 11 arranged between the gate G of the IGBT 21 and the reference potential terminal 41 and configured to adjust the capacitance between the gate G and the emitter E of the IGBT 21 according to a detection temperature detected by the temperature detection element 23. As a result, the semiconductor devices 2a to 2f can suppress loss in the IGBT 21 at high temperature without increasing radiation noise of the IGBT 21.

Embodiment 2

Figure 7:
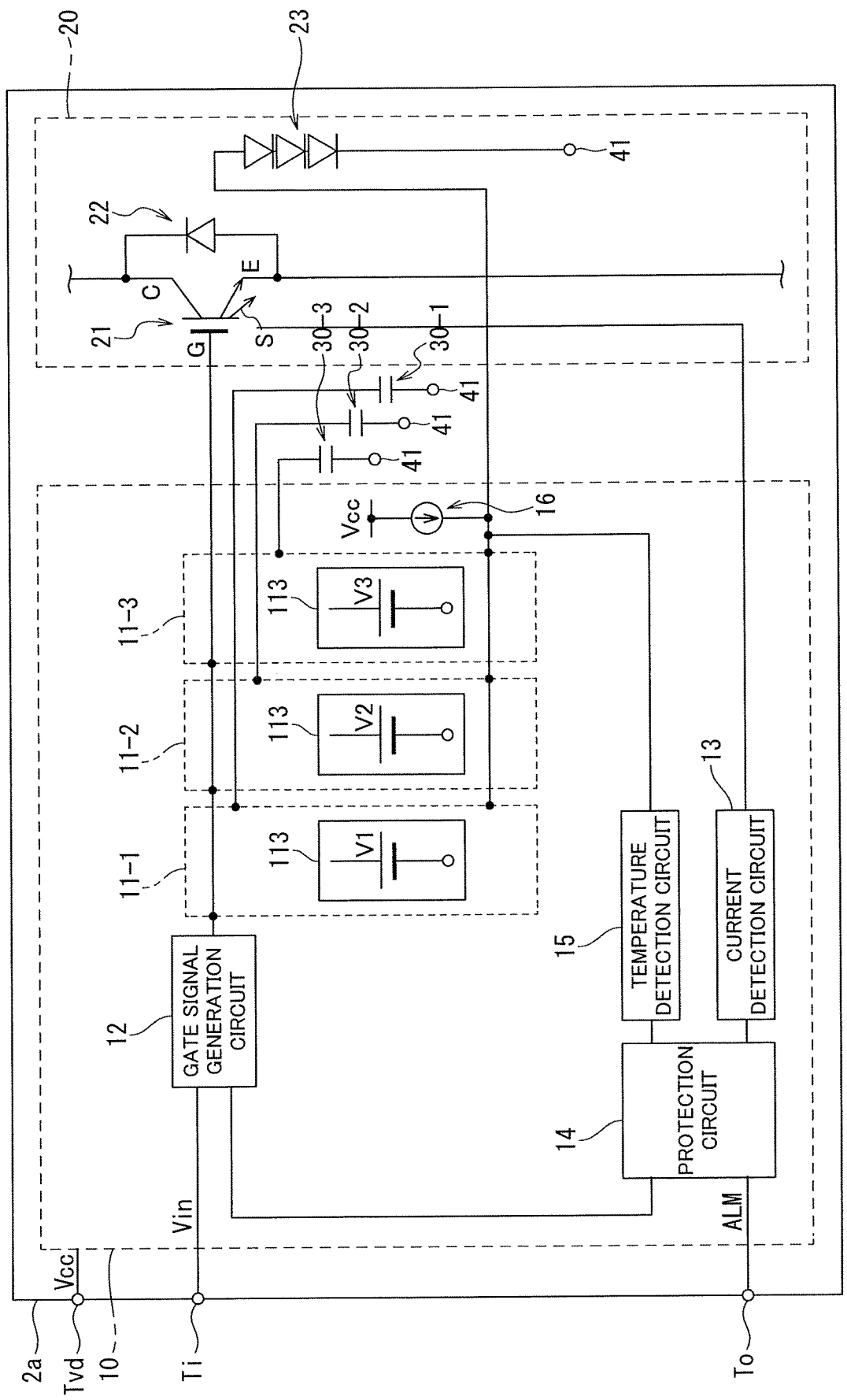
FIG. 7 is a circuit block diagram illustrating a schematic configuration of a semiconductor device according to Embodiment 2 of the present invention.

Semiconductor devices according to Embodiment 2 of the present invention are described using FIG. 7. The semiconductor devices according to the present embodiment are characterized in that the capacitance between the control signal input terminal of the switching element and the reference potential terminal can be adjusted stepwise according to the temperature of the IGBT. A power converter including the semiconductor devices according to the present embodiment is the same as the power converter 1 including the semiconductor devices according to Embodiment 1 above, so that FIG. 1 is referred to as needed below, and a description thereof is omitted. Additionally, in the description of the semiconductor devices according to the present embodiment, components that perform the same actions and functions as those of the components of the semiconductor devices according to Embodiment 1 above are denoted by the same reference signs, and descriptions thereof are omitted.

The semiconductor devices 2a to 2f (see FIG. 1) provided in the power converter in the present embodiment have the same configuration and operate in the same manner. Therefore, the semiconductor devices 2a to 2f are described hereinafter using the semiconductor device 2a as an example.

FIG. 7 is a circuit block diagram illustrating a schematic configuration of a semiconductor device 2a according to the present embodiment. For ease of understanding, FIG. 7 illustrates only voltage generation portions as capacitance adjustment units included in the semiconductor device 2a.

As illustrated in FIG. 7, the semiconductor device 2a according to the present embodiment includes the IGBT (an example of a switching element) 21 including the gate (an example of a control signal input terminal) G to which a gate signal (an example of a switching control signal) is input and the current detection terminal S used to detect at least one of overcurrent or short-circuit current. The semiconductor device 2a includes the temperature detection element 23 that detects temperature of the IGBT 21.

The semiconductor device 2a includes a plurality (three in the present embodiment) of capacitance adjustment units 11-1, 11-2, and 11-3. The capacitance adjustment units 11-1, 11-2, and 11-3 are arranged between the gate G of the IGBT 21 and the reference potential terminal 41 and configured to adjust the capacitance between the gate G and the emitter E of the IGBT 21 according to a detection temperature detected by the temperature detection element 23. The semiconductor device 2a includes a plurality (three in the present embodiment) of gate capacitors 30-1, 30-2, and 30-3 (an example of a capacitor) respectively associated with the capacitance adjustment units that are any one of the plurality of capacitance adjustment units 11-1, 11-2, and 11-3 and that are different from each other. The gate capacitor 30-1 is associated with the capacitance adjustment unit 11-1. The gate capacitor 30-2 is associated with the capacitance adjustment unit 11-2. The gate capacitor 30-3 is associated with the capacitance adjustment unit 11-3.

The capacitance adjustment units 11-1, 11-2, and 11-3 have the same configuration as that of the capacitance adjustment unit 11 (see FIG. 2) in Embodiment 1 above. The gate capacitor 30-1 is connected to the switch circuit 111 (see FIG. 2) provided in the capacitance adjustment unit 11-1. The gate capacitor 30-2 is connected to the switch circuit 111 provided in the capacitance adjustment unit 11-2. The gate capacitor 30-3 is connected to the switch circuit 111 provided in the capacitance adjustment unit 11-3.

The plurality of capacitance adjustment units 11-1, 11-2, and 11-3 control the switch circuit 111 by comparing comparison temperatures having different values from each other with a detection temperature detected by the temperature detection element 23 (see FIG. 2). As illustrated in FIG. 7, the voltage generation portion 113 provided in the capacitance adjustment unit 11-1 is configured to generate a comparison voltage V1, the voltage generation portion 113 provided in the capacitance adjustment unit 11-2 is configured to generate a comparison voltage V2, and the voltage generation portion 113 provided in the capacitance adjustment unit 11-3 is configured to generate a comparison voltage V3.

The comparison voltage V1 is set to a temperature equal to or lower than the absolute maximum rated temperature of the IGBT 21 (hereinafter referred to as "comparison temperature T1"). The comparison voltage V2 is set to a voltage higher than the comparison voltage V1. Therefore, the voltage value of the comparison voltage V1 is set to the same voltage value as that of a detection voltage output when the temperature detection element 23 detects the comparison temperature T1 as the temperature of the IGBT 21. The voltage value of the comparison voltage V2 is set to the same voltage value as that of a detection voltage output when the temperature detection element 23 detects a temperature lower than the comparison temperature T1 by a predetermined amount (hereinafter referred to as "comparison temperature T2"). The voltage value of the comparison voltage V3 is set to the same voltage value as that of a detection voltage output when the temperature detection element 23 detects a temperature lower than the comparison temperature T2 by a predetermined amount and higher than room temperature by a predetermined amount (hereinafter may be referred to as "comparison temperature T3").

Accordingly, the capacitance adjustment unit 11-3 disconnects an electrical connection between one electrode of the gate capacitor 30-3 and the gate G of the IGBT 21 at a detection temperature (comparison temperature T3) lower than in the capacitance adjustment units 11-1 and 11-2, and electrically connects the one electrode of the gate capacitor 30-3 and the reference potential terminal 41. The capacitance adjustment unit 11-2 disconnects an electrical connection between one electrode of the gate capacitor 30-2 and the gate G of the IGBT 21 at a detection temperature (comparison temperature T2) lower than in the capacitance adjustment unit 11-1, and electrically connects the one electrode of the gate capacitor 30-2 and the reference potential terminal 41. Similarly to the capacitance adjustment unit 11 in Embodiment 1 above, the capacitance adjustment unit 11-1 disconnects an electrical connection between one electrode of the gate capacitor 30-1 and the gate G of the IGBT 21 at a detection temperature (comparison temperature Ti) equal to or lower than the absolute maximum rated temperature of the IGBT 21 by a predetermined amount, and electrically connects the one electrode of the gate capacitor 30-1 and the reference potential terminal 41.

More specifically, when the temperature detection element 23 detects a temperature lower than the comparison temperature T3, the detection voltage is higher than the comparison voltages V1 to V3. In this case, the comparator 112 provided in each of the capacitance adjustment units 11-1, 11-2, and 11-3 outputs an output signal at low signal level to the switch circuit 111. Therefore, the MOS transistors 111a provided in the switch circuits 111 of each of the capacitance adjustment units 11-1, 11-2, and 11-3 are all turned on, and the MOS transistors 111b provided in the switch circuits 111 are all turned off. This causes the gate capacitors 30-1, 30-2, and 30-3 to be all electrically connected to the gate G of the IGBT 21 and electrically disconnected from the reference potential terminal 41. As a result, the gate capacitors 30-1, 30-2, and 30-3 are connected in parallel between the gate G of the IGBT 21 and the reference potential terminal 41. Assuming that the capacitance value of the gate capacitor is C1, the capacitance value of the gate capacitor is C2, and the capacitance value of the gate capacitor 30-3 is C3, a capacitance value between the gate G of the IGBT 21 and the reference potential terminal 41 is "C1+C2+C3" (except for a parasitic capacitance Cge between the gate G of the IGBT 21 and the reference potential terminal 41). When the capacitance value of "C1+C2+C3" is the same as the capacitance value of the gate capacitor 30 in Embodiment 1 above, the semiconductor devices 2a to 2f according to the present embodiment can achieve the same radiation noise reduction effect and the same switching loss reduction effect as those of the semiconductor devices 2a to 2f according to Embodiment 1 above at room temperature.

When the temperature detection element 23 detects a temperature equal to the comparison temperature T3 or lower than the comparison temperature T2 (i.e., a temperature that is higher than room temperature by a predetermined amount), the detection voltage is a voltage within a range of from the comparison voltage V3 to higher than the comparison voltage V2. In this case, the comparator 112 provided in the capacitance adjustment unit 11-3 outputs an output signal at high signal level to the switch circuit 111. On the other hand, each comparator 112 provided in the capacitance adjustment units 11-1 and 11-2 outputs an output signal at low signal level to the switch circuit 111. Therefore, the MOS transistor 111a provided in the switch circuit 111 of the capacitance adjustment unit 11-3 is turned off, and the MOS transistor 111b provided in the switch circuit 111 is turned on. On the other hand, the MOS transistors 111a provided in the switch circuits 111 of each of the capacitance adjustment units 11-1 and 11-2 are both turned on, and the MOS transistors 111b provided in the switch circuits are both turned off.

This causes the one electrode of the gate capacitor to be disconnected from the electrical connection with the gate G of the IGBT 21 and electrically connected to the reference potential terminal 41. On the other hand, the one electrodes of each of the gate capacitors 30-1 and 30-2 are both electrically connected to the gate G of the IGBT 21, and electrically disconnected from the reference potential terminal 41. As a result, the gate capacitors 30-1 and 30-2 are connected in parallel between the gate G of the IGBT 21 and the reference potential terminal 41, and the capacitance value between the gate G of the IGBT 21 and the reference potential terminal 41 is "C1+C2" (except for the parasitic capacitance Cge between the gate G of the IGBT 21 and the reference potential terminal 41).

Thus, the semiconductor devices 2a to 2f can reduce the capacitance value of gate capacitor connected between the gate G of the IGBT 21 and the reference potential terminal 41 when the comparison temperature T3 higher than a normal temperature of the IGBT 21 by a predetermined amount is detected.

When the temperature detection element 23 detects a temperature equal to the comparison temperature T2 or lower than the comparison temperature T1, the detection voltage is a voltage within a range of from the comparison voltage V2 to higher than the comparison voltage V1. In this case, the comparator 112 provided in the capacitance adjustment unit 11-2 outputs an output signal at high signal level to the switch circuit 111 provided in the capacitance adjustment unit 11-2. Similarly, the comparator 112 provided in the capacitance adjustment unit 11-3 outputs an output signal at high signal level to the switch circuit 111 provided in the capacitance adjustment unit 11-3. On the other hand, each comparator 112 provided in the capacitance adjustment unit 11-1 outputs an output signal at low signal level to the switch circuit 111. Therefore, the MOS transistors 111a provided in the switch circuits 111 of each of the capacitance adjustment units 11-2 and 11-3 are turned off, and the MOS transistors 111b provided in the switch circuits 111 thereof are turned on. On the other hand, the MOS transistor 111a provided in the switch circuit 111 of the capacitance adjustment unit 11-1 is turned on, and the MOS transistor 111b provided in the switch circuit 111 is turned off.

This causes the one electrode of each of the gate capacitors 30-2 and 30-3 to be disconnected from the electrical connection with the gate G of the IGBT 21 and electrically connected to the reference potential terminal 41. On the other hand, the one electrode of the gate capacitor 30-1 is electrically connected to the gate G of the IGBT 21, and is electrically disconnected from the reference potential terminal 41. As a result, the gate capacitor 30-1 is connected between the gate G of the IGBT 21 and the reference potential terminal 41, and the capacitance value between the gate G of the IGBT 21 and the reference potential terminal 41 is "C1" (except for the parasitic capacitance Cge between the gate G of the IGBT 21 and the reference potential terminal 41).

Thus, when a temperature within the range of from the comparison temperature T2 to lower than the comparison temperature Ti is detected, the semiconductor devices 2a to 2f can reduce the capacitance value of gate capacitor connected between the gate G of the IGBT 21 and the reference potential terminal 41 compared to when a temperature within the range of from the comparison temperature T3 to lower than the comparison temperature T2 is detected.

When the temperature detection element 23 detects a temperature equal to or higher than the comparison temperature Ti, the detection voltage is equal to or lower than the comparison voltage V1. In this case, the comparator 12 provided in the capacitance adjustment unit 11-2 outputs an output signal at high signal level to the switch circuit 111 provided in the capacitance adjustment unit 11-2. Similarly, the comparator 12 provided in the capacitance adjustment unit 11-3 outputs an output signal at high signal level to the switch circuit 111 provided in the capacitance adjustment unit 11-3. Additionally, the comparator 12 provided in the capacitance adjustment unit 11-1 outputs an output signal at high signal level to the switch circuit 111. Therefore, the MOS transistors 111a provided in the switch circuits 111 of each of the capacitance adjustment units 11-1, 11-2, and 11-3 are turned off, and the MOS transistors 111b provided in the switch circuits 111 thereof are turned on.

This causes the one electrode of each of the gate capacitors 30-1, 30-2, and 30-3 to be disconnected from the electrical connection with the gate G of the IGBT 21 and electrically connected to the reference potential terminal 41. As a result, since none of the gate capacitors 30-1, 30-2, and 30-3 are connected between the gate G of the IGBT 21 and the reference potential terminal 41, the capacitance value between the gate G of the IGBT 21 and the reference potential terminal 41 is "0". (except for the parasitic capacitance Cge between the gate G of the IGBT 21 and the reference potential terminal 41).

In this manner, when a temperature equal to or higher than the comparison temperature T3 is detected, the semiconductor devices 2a to 2f can reduce the capacitance value of gate capacitor connected between the gate G of the IGBT and the reference potential terminal 41 compared to when a temperature within the range of from the comparison temperature T3 to lower than the comparison temperature T1 is detected.

Thus, the semiconductor devices 2a to 2f according to the present embodiment can adjust stepwise the capacitance between the gate G of the IGBT 21 and the reference potential terminal 41 according to a detection temperature detected by the temperature detection element 23. As a result, the semiconductor devices 2a to 2f according to the present embodiment can more effectively reduce radiation noise and switching loss of the IGBT 21 according to the temperature of the IGBT 21 than the semiconductor devices 2a to 2f according to Embodiment 1 above.

As described above, the semiconductor devices 2a to 2f according to the present embodiment include the plurality of capacitance adjustment units 11-1, 11-2, and 11-3 and the plurality of gate capacitors 30-1, 30-2, and 30-3 respectively associated with the capacitance adjustment units that are any one of the plurality of capacitance adjustment units 11-1, 11-2, and 11-3 and that are different from each other. The plurality of capacitance adjustment units 11-1, 11-2, and 11-3 are configured to compare the comparison temperatures Ti, T2, T3 having mutually different values with a detection temperature detected by the temperature detection elements 23 to control the switch circuits 111.

This allows the semiconductor devices 2a to 2f according to the present embodiment to adjust stepwise the capacitance between the gate G of the IGBT 21 and the reference potential terminal 41 according to the detection temperature detected by the temperature detection element 23. As a result, the semiconductor devices 2a to 2f according to the present embodiment can suppress the loss of the IGBT 21 according to the temperature of the IGBT 21 without increasing the radiation noise of the IGBT 21 in addition to the effects of the semiconductor devices 2a to 2f according to Embodiment 1 above.

Embodiment 3

Figure 8:
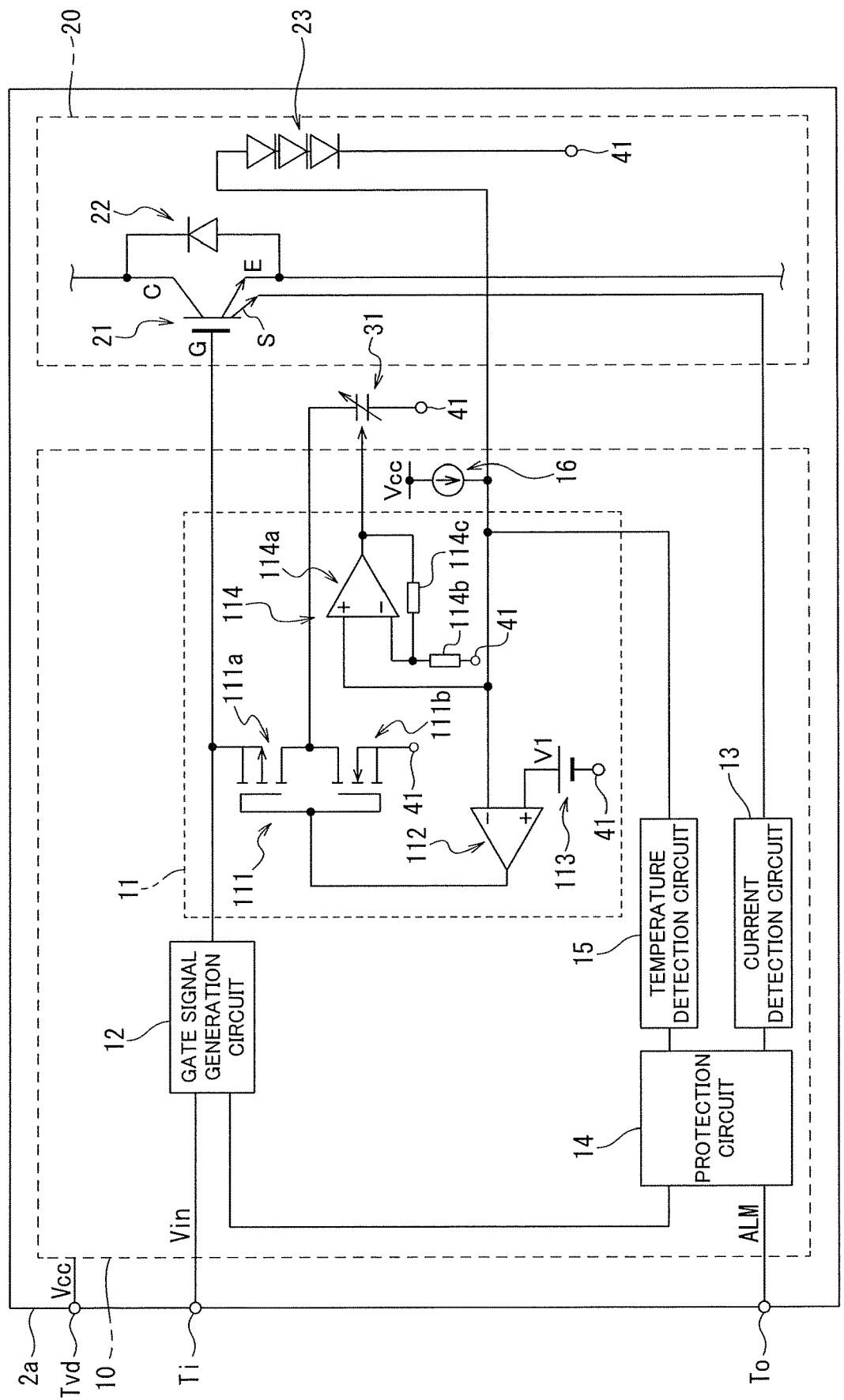
FIG. 8 is a circuit block diagram illustrating a schematic configuration of a semiconductor device according to Embodiment 3 of the present invention.

Semiconductor devices according to Embodiment 3 of the present invention are described using FIG. 8. The semiconductor devices according to the present embodiment are characterized in that the capacitance between the control signal input terminal of the switching element and the reference potential terminal can be continuously adjusted according to the temperature of the IGBT. A power converter including the semiconductor devices according to the present embodiment is the same as the power converter 1 including the semiconductor devices according to Embodiment 1 above. Therefore, FIG. 1 is referred to as needed below, and a description thereof is omitted. Additionally, in the description of the semiconductor devices according to the present embodiment, components that perform the same actions and functions as those of the components of the semiconductor devices according to Embodiment 1 above are denoted by the same reference signs, and descriptions thereof are omitted.

The semiconductor devices 2a to 2f (see FIG. 1) provided in the power converter in the present embodiment have the same configuration and operate in the same manner. Therefore, the semiconductor devices 2a to 2f are described hereinafter using the semiconductor device 2a as an example.

FIG. 8 is a circuit block diagram illustrating a schematic configuration of a semiconductor device 2a according to the present embodiment.

As illustrated in FIG. 8, a gate capacitor 31 included in the semiconductor device 2a according to the present embodiment is a variable capacitance capacitor. The gate capacitor 31 has a capacitance variable depending on a voltage input to a control terminal thereof.

The semiconductor device 2a according to the present embodiment includes a non-inverting amplifier circuit 114 in addition to the capacitance adjustment unit 11 included in the semiconductor device 2a according to Embodiment 1 above. An output of the non-inverting amplifier circuit 114 is connected to the control terminal of the gate capacitor 31.

More specifically, the non-inverting amplifier circuit 114 includes an amplifier 114a having a non-inverting input terminal (+) connected to the output of the temperature detection element 23 and composed of, for example, an operational amplifier. An output terminal of the amplifier 114a is connected to the control terminal of the gate capacitor 31. The non-inverting amplifier circuit 114 includes a resistance element 114b having one terminal connected to an inverting input terminal (−) of the amplifier 114a and the other terminal connected to the reference potential terminal 41. The non-inverting amplifier circuit 114 includes a resistance element 114c connected between the inverting input terminal (−) of the amplifier 114a and the output terminal of the amplifier 114a. The resistance element 114c has one terminal connected to the output terminal of the amplifier 114a and the other terminal connected to the inverting input terminal (−) of the amplifier 114a and the one terminal of the resistance element 114b. The resistance element 114b and the resistance element 114c form a feedback circuit.

The non-inverting amplifier circuit 114 is configured to amplify a detection voltage input from the temperature detection element 23 with an amplification factor based on a ratio of a resistance value of the resistance element 114*b* and a resistance value of the resistance element 114*c* and output to the control terminal of the gate capacitor 31. The temperature detection element 23 outputs a lower detection voltage as the temperature of the IGBT 21 is higher (the detection temperature is higher). Therefore, the non-inverting amplifier circuit 114 outputs a lower output voltage to the control terminal of the gate capacitor 31 as the detection temperature detected by the temperature detection element 23 is higher. The gate capacitor 31 has characteristics in which the lower the voltage input to the control terminal, the smaller the capacitance value, for example. Accordingly, the semiconductor device 2*a* according to the present embodiment can reduce the capacitance value of the gate capacitor 31 as a detection temperature detected by the temperature detection element 23 increases.

Additionally, the capacitance adjustment unit 11 in the present embodiment includes the switch circuit 111. Therefore, the semiconductor device 2*a* can disconnect the connection between the gate capacitor 31 and the gate G of the IGBT 21 when the detection temperature detected by the temperature detection element 23 is equal to or higher than a comparison temperature set on the basis of the absolute maximum rated temperature of the IGBT 21.

As described above, the semiconductor devices 2*a* to 2*f* according to the present embodiment includes the capacitance adjustment unit 11. This enables the semiconductor devices 2*a* to 2*f* according to the present embodiment to obtain the same effects as those of the semiconductor devices 2*a* to 2*f* according to Embodiment 1 above. Additionally, the semiconductor devices 2*a* to 2*f* according to the present embodiment includes the variable capacitance gate capacitor 31. This enables the semiconductor devices 2*a* to 2*f* according to the present embodiment to adjust the capacitance between the IGBT 21 and the reference potential terminal 41 according to a detection temperature detected by the temperature detection element 23. As a result, the semiconductor devices 2*a* to 2*f* according to the present embodiment can achieve suppression of the loss of the IGBT 21 according to the temperature of the IGBT 21 without increasing the radiation noise of the IGBT 21.

The present invention is not limited to the above embodiments, and can be modified in various ways.

Although the semiconductor devices 2*a* to 2*f* according to the above embodiments include the IGBT 21 as the switching element, the present invention is not limited thereto. The switching element included in the semiconductor devices may be an IGBT, a bipolar transistor, or a MOS transistor. In addition, the switching element may be a wide bandgap semiconductor element including SiC, GaN, diamond, gallium nitride-based material, gallium oxide-based material, AlN, AlGaN, ZnO, or the like.

Although the MOS transistor 111*a* and the MOS transistor 111*b* in the above embodiments have the complementary configuration in which they are connected in series between the gate G of the IGBT 21 and the reference potential terminal 41, the present invention is not limited thereto. The switches provided in the capacitance adjustment units 11, 11-1, 11-2, and 11-3 need not have a complementary configuration as long as they operate in the same manner as complementary switch circuits. For example, a plurality of (e.g., two) switches (e.g., MOS transistors) provided in the capacitance adjustment units 11, 11-1, 11-2, and 11-3 may be configured to be individually controlled by different signals.

The technological scope of the present invention is not limited to the exemplary embodiments depicted and described, but rather encompasses all embodiments that provide advantageous effects equivalent to those intended by the present invention. Additionally, the technological scope of the present invention is not limited to combinations of features of the present invention defined by the claims, but rather can also be defined by any other desired combination of specific features of all disclosed individual features.

REFERENCE SIGNS LIST

1: Power converter
2: Inverter circuit
2*a*, 2*b*, 2*c*, 2*d*, 2*e*, 2*f*: Semiconductor device
2U: U-phase output arm
2V: V-phase output arm
2W: W-phase output arm
3: Three-phase AC power supply
4: Rectifier circuit
5: Smoothing capacitor
6: Controller
7: Motor
10: Gate driver circuit
11, 11-1, 11-2, 11-3: Capacitance adjustment unit
12: Gate signal generation circuit
13: Current detection circuit
14: Protection circuit
15: Temperature detection circuit
16: Constant current circuit
20: Semiconductor element
21: IGBT
22: Free wheeling diode
23: Temperature detection element
30-1, 30-2, 30-3, 31: Gate capacitor
41: Reference potential terminal
111: Switch circuit
111*a*, 111*b*: MOS transistor
112: Comparator
113: Voltage generation portion
114: Non-inverting amplifier circuit
114*a*: Amplifier
114*b*, 114*c*: Resistance element
ALM: Alarm signal
C: Collector
E: Emitter
G: Gate
Ln: Negative-side line
Lp: Positive-side line
S: Current detection terminal
T1, T2, T3, Tc: Comparison temperature
Ti: Signal input terminal
To: Signal output terminal
Tvd: Power supply terminal
V1, V2, V3: Comparison voltage
Vcc: Power supply voltage
Vin: Input signal

The invention claimed is:

1. A semiconductor device comprising:
a switching element including a control signal input terminal where a switching control signal is input;
a temperature detection element configured to detect temperature of the switching element to output a detection temperature; and
a capacitance adjustment unit arranged between the control signal input terminal and a reference potential terminal and configured to adjust a capacitance between a gate and an emitter of the switching element according to the detection temperature, wherein a capacitor is arranged between the capacitance adjustment unit and the reference potential terminal.

2. The semiconductor device according to claim 1, wherein the capacitance adjustment unit includes a switch circuit configured to disconnect a connection between the control signal input terminal and the capacitor when the detection temperature is equal to or higher than a predetermined comparison temperature, and connects the control signal input terminal and the capacitor when the detection temperature is lower than the comparison temperature.

3. The semiconductor device according to claim 2, wherein the switch circuit serves to switch to a circuit configuration for discharging electric charge of the capacitor when the detection temperature is equal to or higher than the comparison temperature.

4. The semiconductor device according to claim 2, wherein the switch circuit includes a disconnection switch provided to be able to disconnect the connection between the control signal input terminal and the capacitor.

5. The semiconductor device according to claim 4, wherein the disconnection switch disconnects the connection between the control signal input terminal and the capacitor when the detection temperature is equal to or higher than the comparison temperature, and connects the control signal input terminal to the capacitor when the detection temperature is lower than the comparison temperature.

6. The semiconductor device according to claim 4, wherein the switch circuit includes a connection switch provided to able to discharge the electric charge of the capacitor.

7. The semiconductor device according to claim 6, wherein the connection switch connects the reference potential terminal to the capacitor when the detection temperature is equal to or higher than the comparison temperature, and disconnects the reference potential terminal from the capacitor when the detection temperature is lower than the comparison temperature.

8. The semiconductor device according to claim 6, wherein the disconnection switch and the connection switch include a complementary configuration in which the switches are connected in series between the control signal input terminal and the reference potential terminal.

9. The semiconductor device according to claim 6, wherein the capacitance adjustment unit includes a comparator portion configured to compare a detection voltage input from the temperature detection element and corresponding to the detection temperature with a comparison voltage corresponding to the comparison temperature, in which
  when the comparator portion outputs a signal indicating that the detection voltage is equal to or lower than the comparison voltage, the disconnection switch disconnects the connection between the capacitor and the control signal input terminal, and the connection switch connects the capacitor to the reference potential terminal, and
  when the comparator portion outputs a signal indicating that the detection voltage is higher than the comparison voltage, the disconnection switch does not disconnect the connection between the capacitor and the control signal input terminal, and the connection switch disconnects the capacitor from the reference potential terminal.

10. The semiconductor device according to claim 2, comprising:
  a plurality of the capacitance adjustment units; and
  a plurality of the capacitors respectively associated with the capacitance adjustment units that are any one of the plurality of capacitance adjustment units and that are different from each other,
  wherein the plurality of capacitance adjustment units compares the comparison temperatures including mutually different values with the detection temperature to control the switch circuit.

11. The semiconductor device according to claim 1, wherein the capacitor is a variable capacitance capacitor.

* * * * *